United States Patent
Haws

(10) Patent No.: US 7,454,920 B2
(45) Date of Patent: Nov. 25, 2008

(54) METHOD AND APPARATUS FOR MOISTURE CONTROL WITHIN A PHASED ARRAY

(75) Inventor: James L. Haws, McKinney, TX (US)

(73) Assignee: Raytheon Company, Waltham, MA (US)

( * ) Notice: Subject to any disclaimer, the term of this patent is extended or adjusted under 35 U.S.C. 154(b) by 537 days.

(21) Appl. No.: 10/983,001

(22) Filed: Nov. 4, 2004

(65) Prior Publication Data

US 2006/0090489 A1 May 4, 2006

(51) Int. Cl.
  *F25D 23/12* (2006.01)
  *G01N 27/22* (2006.01)
(52) U.S. Cl. .............. 62/176.6; 62/259.2; 236/44 C; 236/44 E; 165/80.4; 340/602; 361/699
(58) Field of Classification Search ............ 62/176.1, 62/176.2, 259.2; 236/44 R, 44 C, 44 E; 340/602, 340/604; 165/80.4; 361/699
  See application file for complete search history.

(56) References Cited

U.S. PATENT DOCUMENTS

| | | | | |
|---|---|---|---|---|
| 5,240,556 A | * | 8/1993 | Ishikawa et al. | 216/67 |
| 5,968,386 A | * | 10/1999 | Goenka et al. | 219/209 |
| 6,161,765 A | | 12/2000 | Kay et al. | |
| 6,205,796 B1 | * | 3/2001 | Chu et al. | 62/94 |
| 6,344,777 B1 | * | 2/2002 | Ingram et al. | 330/295 |
| 7,064,953 B2 | * | 6/2006 | Miller | 361/690 |
| 7,114,266 B2 | * | 10/2006 | Gomes et al. | 34/80 |
| 7,195,177 B2 | * | 3/2007 | Haws et al. | 236/44 A |
| 2004/0255598 A1 | | 12/2004 | Haws et al. | |

FOREIGN PATENT DOCUMENTS

EP    0 928 127 A2    7/1999

OTHER PUBLICATIONS

U.S. Appl. No. 10/193,571, entitled "*Method and Apparatus for Removing Heat from a Circuit*", Haws et al., (36 pages), status pending, Jul. 11, 2002.

* cited by examiner

*Primary Examiner*—Marc E Norman
(74) *Attorney, Agent, or Firm*—Baker Botts L.L.P.

(57) ABSTRACT

An apparatus includes a circuit having a heat-generating circuit component, and structure for guiding a two-phase coolant along a path which brings the coolant into direct physical contact with either the circuit component or a highly thermally conductive part which is thermally coupled to the circuit component. The coolant absorbs heat generated by the circuit component, at least part of the coolant changing from a first phase to a second phase in response to the heat absorbed from the circuit component, where the second phase is different from the first phase.

9 Claims, 3 Drawing Sheets

US 7,454,920 B2

METHOD AND APPARATUS FOR MOISTURE CONTROL WITHIN A PHASED ARRAY

TECHNICAL FIELD OF THE INVENTION

This invention relates in general to techniques for cooling circuitry and, more particularly, to a method and apparatus for efficiently removing heat from a circuit which generates relatively large amounts of heat.

BACKGROUND OF THE INVENTION

Some types of circuits produce very little heat, and can be operated with a passive cooling technique, such as convection cooling. On the other hand, there are a variety of circuits which produce extremely large amounts of heat, and require some sort of active cooling. One example is a high-power phased array antenna system, which consumes large amounts of electrical power, typically on the order of tens of thousands of watts.

These phased array antenna systems commonly include monolithic microwave integrated circuits (MMICs), which consume substantial amounts of power, and which generate substantial amounts of heat. Pre-existing systems of this type usually include MMICs that need cooling for a thermal density of no more than about 100 Watts/in$^2$. However, the industry trend is toward the development and use of MMIC devices which consume substantially higher amounts of power and which dissipate substantially greater amounts of heat. One example is gallium nitride (GaN) MMIC technology, and another example is gallium arsenide (GaAs) MMIC technology. In a GaN MMIC, the typical thermal density can be on the order of at least 400 Watts/in$^2$, when the radio frequency duty cycle is at 100%. Although pre-existing techniques for cooling phased array antenna systems have been generally adequate for their intended purposes, they use a single phase coolant, such as a refrigeration-cooled polyalphaolefin (PAO). Such a pre-existing cooling system with a single-phase coolant is only capable of handling thermal densities up to about 100 Watts/in$^2$. Consequently, these pre-existing cooling systems and techniques are not entirely satisfactory for the levels of heat dissipated by next-generation technology in phased array antenna systems.

SUMMARY OF THE INVENTION

From the foregoing, it may be appreciated that a need has arisen for a method and apparatus for providing more effective cooling of heat-generating circuit components. According to one form of the present invention, a method and apparatus are provided to address this need, and involve: operating a circuit which includes a heat-generating circuit component; and guiding a two-phase coolant along a path which brings the coolant into direct physical contact with the circuit component or with a highly thermally conductive part which is thermally coupled to the circuit component. The coolant absorbs heat generated by the circuit component, at least part of the coolant changing from a first phase to a second phase in response to heat absorbed from the circuit component, where the second phase is different from the first phase.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
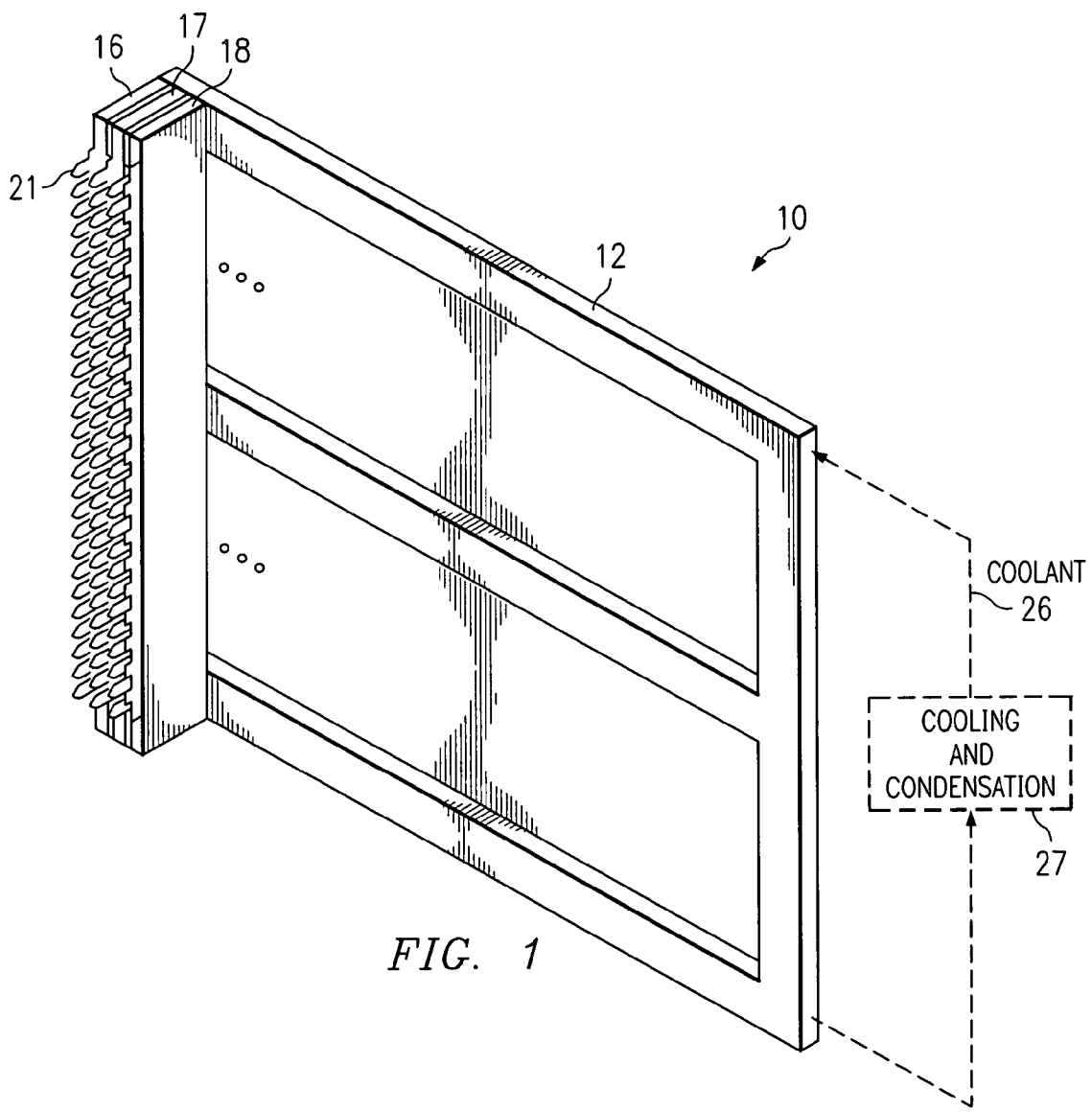
FIG. 1 is a diagrammatic perspective view of part of a phased array antenna system which embodies the present invention.

FIG. 1 is a diagrammatic perspective view of part of an apparatus which is a phased array antenna system 10. The antenna system 10 includes a frame or chassis 12. The chassis 12 supports a plurality of modules of a type commonly known as slats, three of which are shown in FIG. 1 at 16-18. In an operational configuration, a larger number of slats would be installed in the frame 12, so that the frame 12 is effectively filled with slats.

In the embodiment of FIG. 1, the slats are all identical, including the three slats shown at 16-18. Each slat has, along an edge opposite from the frame 12, a row of outwardly projecting antenna elements 21. The antenna elements 21 on all of the slats collectively define a two-dimensional array of antenna elements. Each slat includes circuitry with transmit and receive capabilities, and this circuitry is operationally coupled to the antenna elements 21 on that slat. The frame 12 carries electrical signals and coolant to and from each of the slats, in a manner which is known in the art and which is therefore not illustrated and described here in detail. In this regard, FIG. 1 diagrammatically shows a cooling and condensation system 27 which is capable of cooling a coolant in its vapor phase, so as to return the coolant to its liquid phase. Coolant from the frame 12 is circulated through the system 27 along a path which is indicated diagrammatically in FIG. 1 by reference numeral 26.

In a pre-existing phased array antenna system, the transmit/receive circuitry includes monolithic microwave integrated circuits (MMICs), which need active cooling that can remove heat at a rate which is less than about 100 Watts/in$^2$. Newer MMICs include gallium nitride (GaN) technology, and dissipate significantly greater amounts of heat, for example 500 Watts/in$^2$. In the embodiment of FIG. 1, the antenna system 10 uses GaN MMIC technology, and includes a cooling configuration capable of efficiently removing heat at rate of 500 Watts/in$^2$. In fact, the cooling arrangement provided for the antenna system 10 of FIG. 1 is capable of removing heat at rates up to approximately 1,000 Watts/in$^2$.

Figure 2:
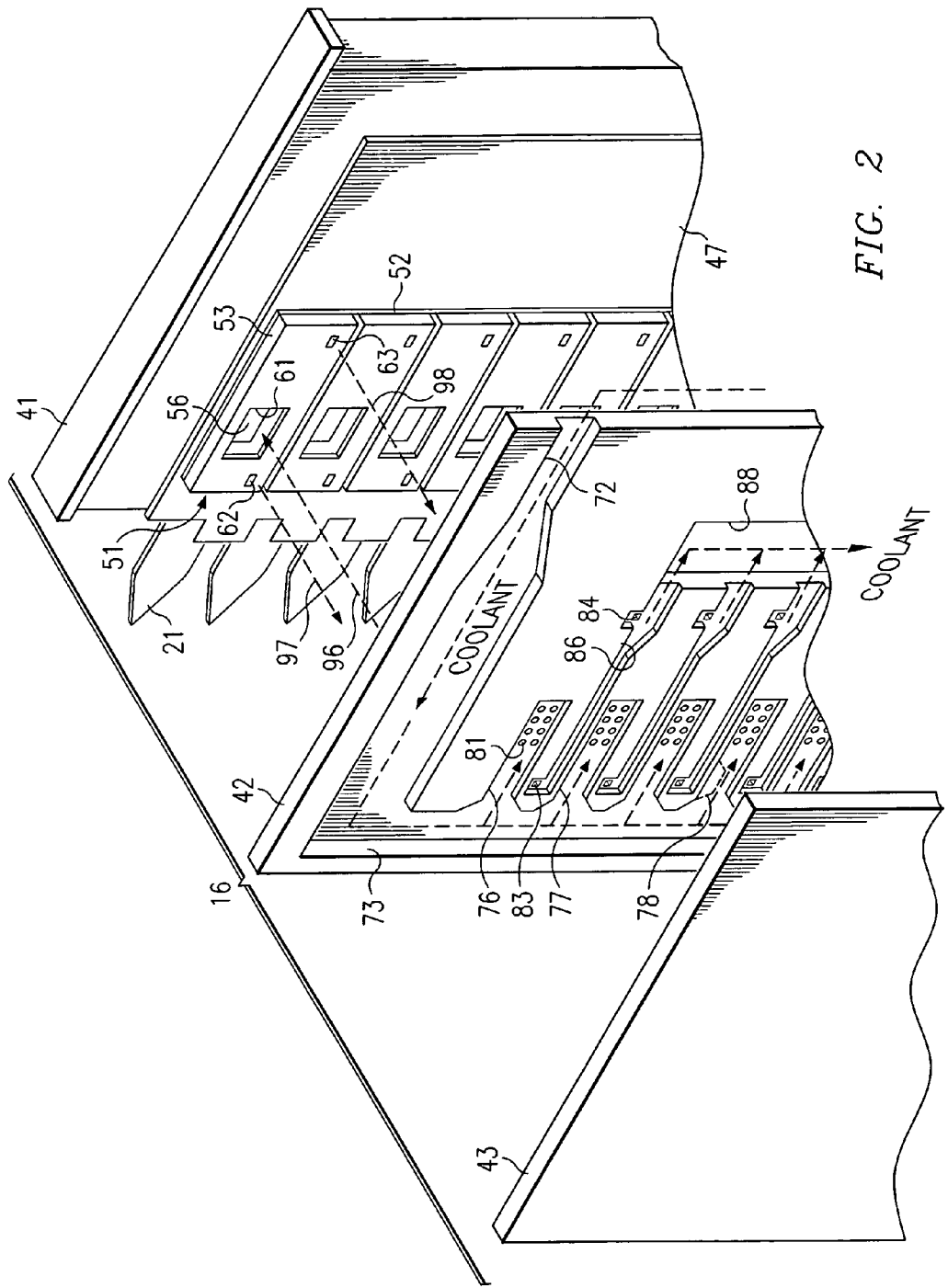
FIG. 2 is a diagrammatic exploded fragmentary perspective view of a slat which is a component of the system of FIG. 1.

As mentioned above, the slats in the antenna system 10 of FIG. 1 are all effectively identical. Therefore, for purposes of explaining how they are cooled, the following discussion addresses only one of the slats in detail, in particular the slat 16. In more detail, FIG. 2 is a diagrammatic exploded fragmentary perspective view of the slat 16 of FIG. 1. As shown in FIG. 2, the slat 16 includes a slat member 41, a cooling plate 42, and a cover plate 43, the cooling plate 42 being sandwiched between the slat member 41 and the cover plate 43. In the disclosed embodiment, the slat member 41, cooling plate 42 and cover plate 43 are each made of aluminum silicon carbide (AlSiC), due in part to the fact that it has a coefficient of thermal expansion (CTE) comparable to that of other components within the slat, so as to avoid thermally-induced structural stress. However, one or more of the parts 41-43 could alternatively be made of some other suitable material.

The slat member 41 has a row of the antenna elements 21 supported thereon. A multi-layer circuit board 47 is supported on a side of the slat member 41 which faces the cooling plate 42. The circuit board 47 is electrically coupled to the frame 12 (FIG. 1) through connectors in a manner which is known in the art and therefore not illustrated and described here in detail. The circuit board 47 has, on the side thereof which is not visible in FIG. 2, a plurality of radio frequency (RF) probes that are disposed along the edge adjacent the antenna elements 21. When the antenna system 12 is transmitting, the probes excite the antenna elements 21 in response to a suitable RF signal from the circuit board 47. On the other hand, when the antenna system 12 is receiving, the antenna element excite the probes in response to an incoming RF signal.

The circuit board 47 has mounted thereon a vertical column of transmit/receive modules, one of which is identified in FIG. 2 by reference numeral 51. Each of the transmit/receive modules is associated with a respective one of the antenna elements 21. The transmit/receive modules are identical, and therefore only the module 51 is discussed below in further detail.

More specifically, the module 51 includes a ceramic base plate 52, which is hermetically sealed along its peripheral edge to a ceramic cover 53, thereby defining a module housing. The module 51 includes within this housing a circuit board, which has a GaN MMIC 56 mounted thereon. The side of the MMIC 56 which is visible in FIG. 2 is the side commonly referred to as the active-junction side. Aside from the MMIC 56, the circuit board within the module 51 is generally not visible in FIG. 2. As mentioned above, the circuitry provided on the circuit board within each module has a configuration of a type which is known in the art, and which is therefore not described here in detail.

The cover 53 of the module 51 has a rectangular opening 61, which is aligned with the MMIC 56 and serves as an inlet port through which coolant can enter the module 51, as discussed in more detail later. The cover 53 has near its opposite lower corners two output ports 62 and 63, through which coolant exits the module 51, as discussed later.

The circuit board within the module 51 is electrically coupled to the multi-layer circuit board 47. In the enclosed embodiment, the facing surfaces of the circuit board 47 and the base plate 52 each have a plurality of not-illustrated pads, and respective pairs of these pads are electrically coupled to each other by a grid of solder drops or balls, in a configuration of the type generally known in the art as a ball grid array. The base plate 52 of the module 51 has a plurality of not-illustrated vias, which each extend through it in a manner facilitating a hermetic seal. One end of each via is coupled to one of the pads provided on the base plate 52, and the other end of each via is electrically coupled in some suitable manner to the circuit board in the module 51.

In the assembled configuration of the slat 16, a seal exists between the cooling plate 42 and each of the modules provided on the slat member 41, including the module 51. In the disclosed embodiment, this is effected through the use of a low-temperature solder provided between the cooling plate 42 and each of the modules. However, the seal could alternatively be effected in some other suitable manner, for example with a compression seal. Still another alternative approach is to use a seal which extends along the periphery of the cooling plate 42 and the periphery of the group of modules, in a manner so that the inlet and outlet ports 61-63 are not sealed relative to each, but are all sealed relative to structure external to the seal.

The cooling plate 42 has, on the side thereof opposite from the slat member 41, a configuration of shallow channels or grooves that are formed through machining, casting or molding. This network of channels includes an inlet port 72, which can be operatively coupled to a coolant supply line located within the frame 12 (FIG. 1), for example through use of a quick-disconnect coupling of a type which is known in the art and therefore not shown and described in here detail. The use of quick-disconnect couplings permits a slat to be removed and replaced without draining coolant from the entire system. The inlet port 72 leads to a high-pressure inlet channel 73, which in turn communicates with a plurality of orifices, two of which are designated in FIG. 2 by respective reference numerals 76 and 77. In the disclosed embodiment, there is one orifice for each of the modules provided on the circuit board 47, including the module 51.

In FIG. 2, the illustrated orifices are all the same size. However, as shown diagrammatically by the broken line 78, it would alternatively be possible for some of the orifices to be larger or smaller than others, so that some of the modules on the circuit board 47 intentionally receive more or less coolant than other modules, thereby supplying more or less coolant to modules which need proportionally more or less cooling.

After a portion of the coolant from the inlet channel 73 passes through any one of the orifices, it reaches a respective group or array of small feed openings 81, which extend transversely through the cooling plate 42. Each group of feed opening 81 is aligned with the opening 61 in a respective one of the transmit/receive modules. The cooling plate 42 also has several pairs of return openings 83 and 84, which each extend transversely through the cooling plate 42 and which each communicate with a respective one of the outlet ports 62 and 63 in a respective one of the modules. Each pair of return openings 83 and 84 communicates with a respective low-pressure return channel 86. The return channels 86 all lead to a somewhat deeper channel 88, which serves as a low-pressure collection chamber. Coolant from the collection chamber 88 travels from the cooling plate 42 to a not-illustrated outlet port, which is coupled to the frame 12 (FIG. 1) by a not-illustrated quick-disconnect fitting of a known type.

In the assembled configuration of the slat 16, the cover 43 has its peripheral edges sealed with respect to peripheral edges of the cooling plate 42, for example by brazing or welding, or by a not-illustrated gasket. Further, the peripheral edges of the cooling plate 42 are sealed in a similar manner to peripheral edges of the slat member 41.

The embodiment of FIGS. 1 and 2 effects what can be referred to as "front side" cooling of the MMICs 56 in each module, in that the coolant directly contacts the active-junction side of each MMIC. This requires a coolant which is thermally conductive but electrically non-conductive. To meet these criteria, the embodiment of FIGS. 1 and 2 uses as the coolant a fluorinert of a known type, such as that commercially available as FC-77. Due to the fact that the coolant directly engages the MMIC, without intervening structure, the temperature differential between the coolant and active-junction of the MMICs is minimized, which helps to keep the junction temperatures of the MMICs low, which in turn increases the operational lifetime and reliability of the MMICs.

In operation, coolant in a liquid phase is supplied through the frame 12 to each of the slats, including the slat 16. The portion of the coolant which enters the slat 16 flows into the cooling plate 42 through the inlet 72. This coolant then travels through the inlet channel 73, where it splits so that a respective portion of it passes through each of the orifices, including the orifices shown at 76 and 77. After passing through these orifices, respective portions of the coolant each reach and pass through a respective group of the openings 81, and then each flow through the opening 61 in a respective one of the modules, as indicated diagrammatically in FIG. 2 by the broken line 96.

After entering each module through the associated opening 61, the coolant directly contacts the exposed active-junction side of the MMIC 56 in that module, and absorbs heat from the MMIC 56. Due to this absorption of heat, part or all of the coolant in that module boils and changes from its liquid phase to its vapor phase. This phase change is inherently associated with absorption of a substantial amount of heat by the coolant. The coolant inside the module, including vapor and possibly some liquid, then flows within the module from the region of the opening 61 toward the outlet ports 62 and 63, absorbing heat from other components on the circuit board within the module. In each module, respective portions of the coolant exit the module through the outlet ports 62 and 63 of that module, and then respectively pass through the associated pair of return openings 83 and 84 in the cooling plate 42, as indicated diagrammatically in FIG. 2 by the broken lines 97 and 98. The portions of the coolant passing through each pair of the return openings 83 and 84 then enter a respective one of the channels 86, where they travel to the collection chamber 88.

From the collection chamber 88, the coolant travels to the not-illustrated outlet port for the slat 16. The coolant which exits the slat 16 through the outlet port flows through a channel provided within the frame 12, and then travels along the path 26 through the cooling and condensation system 27, where it is cooled and returned to a liquid phase. This cooled liquid coolant is then routed back into the frame 12, where it is again distributed among the inlet ports 72 of the slats.

In FIG. 2, the cooling plate 42 is shown as being sandwiched between the slat member 41 and the cover plate 43. However, in an alternative configuration, the cover plate 43 can be replaced with a cooling plate and a slat member which are mirror images of the cooling plate 42 and slat member 41, resulting in a single slat that has a central cooling arrangement sandwiched between and serving two vertical columns of antenna elements and transmit/receive modules.

As discussed above, the embodiment of FIGS. 1 and 2 uses a fluorinert as the coolant, because a fluorinert is thermally conductive but electrically non-conductive. As also discussed above, a significant part of the cooling effect is obtained by the phase change of the coolant, from its liquid phase to its vapor phase. The amount of heat absorbed by a coolant as it changes from a liquid to a vapor is known as its latent heat of vaporization.

There are known coolants which have a latent heat of vaporization substantially higher than that of the fluorinert used in FIGS. 1 and 2. In other words, when these other coolants change from a liquid to a vapor, they absorb substantially more heat per unit of volume than a fluorinert. For example, water has a latent heat of vaporization which is higher than that of virtually any other suitable coolant, and which is about 20 times the latent heat of vaporization of a typical fluorinert. Stated differently, the volume of a fluorinert which must flow in order to remove a specified amount of heat is about 20 times the volume of water that must flow in order to remove the same amount of heat. In addition to water, coolants that have latent heats of vaporization greater than a fluorinert include methanol, ammonia, a mixture of water and ethylene glycol, and a mixture of water and methanol.

Due to the fact that they have higher latent heats of vaporization, these other types of coolant have the potential to cool more efficiently than an equal amount of a fluorinert. On the other hand, all of these various other coolants are electrically conductive, and thus are not suitable for use in the embodiment of FIGS. 1 and 2, because they cannot be brought into direct contact with a MMIC. Therefore, in order to provide for use of one of these other types of coolant (or even a fluorinert), a further embodiment is shown and described in association with FIG. 3, where efficient cooling is achieved without direct contact between the coolant and a circuit component such as a MMIC.

Figure 3:
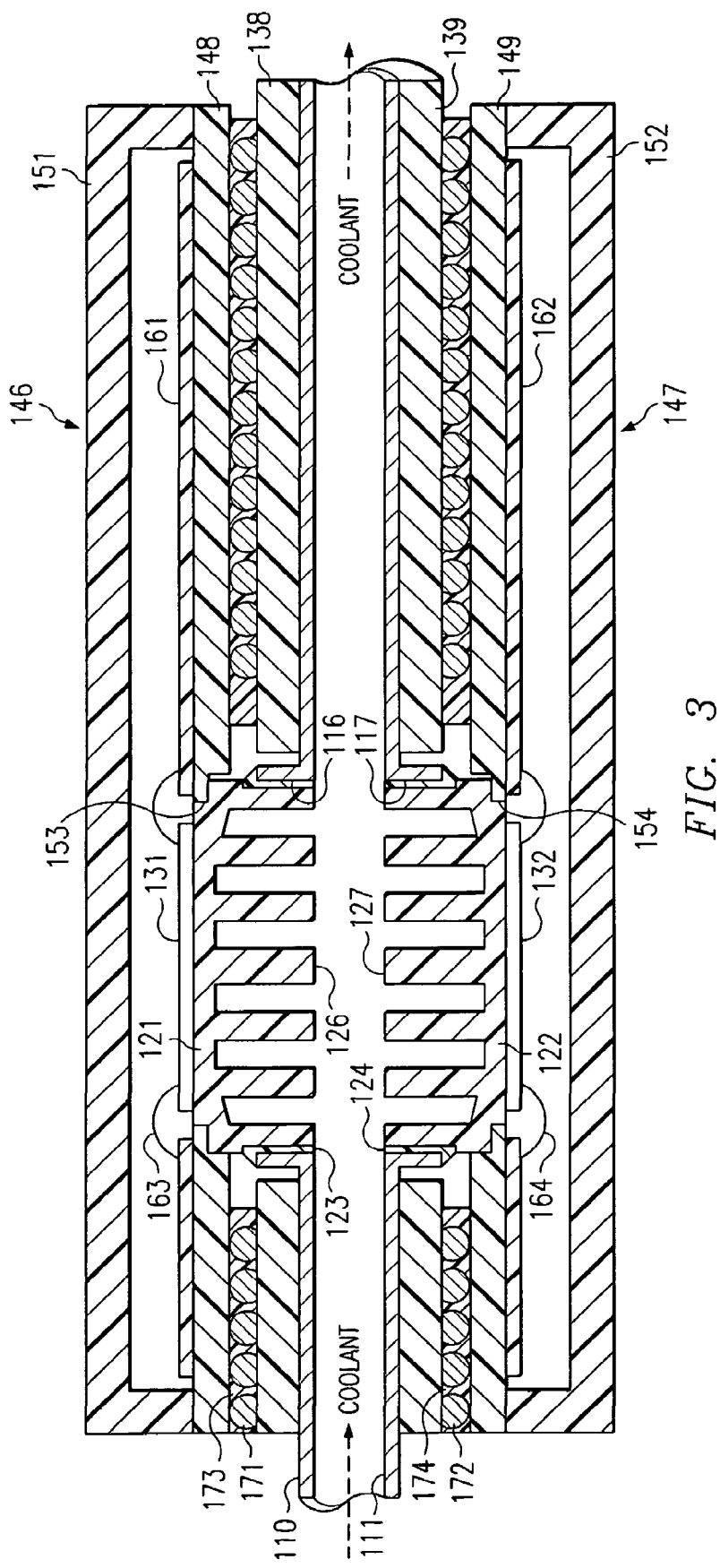
FIG. 3 is a diagrammatic fragmentary sectional top view of part of a slat which is an alternative embodiment of the slat shown in FIG. 2.
Figure 2:
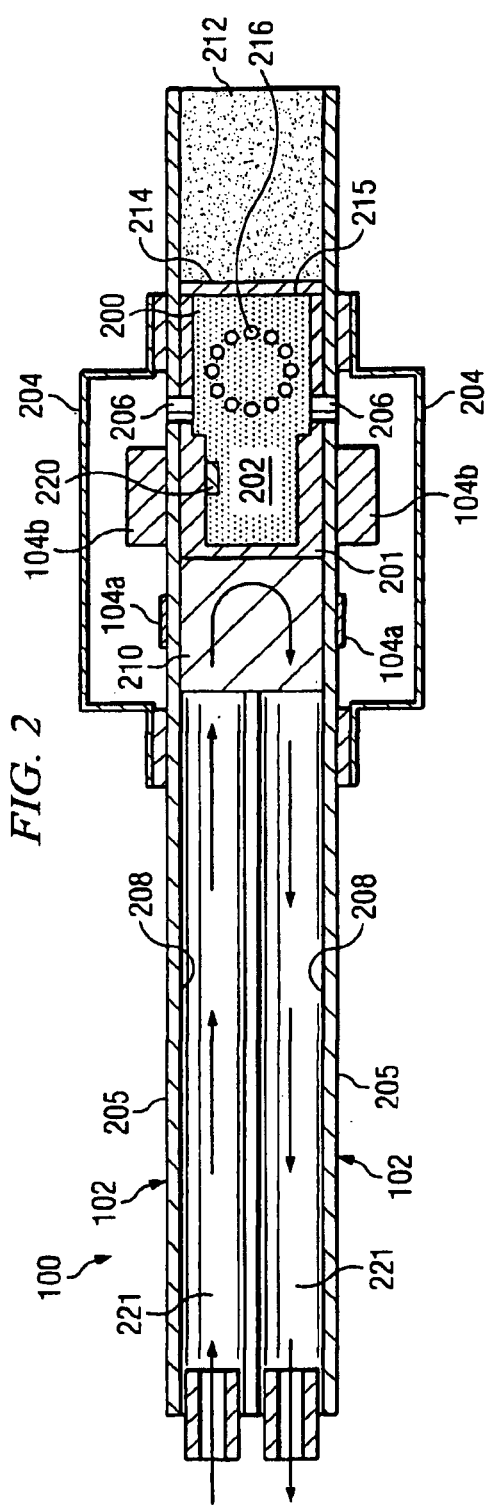
Figure 3:
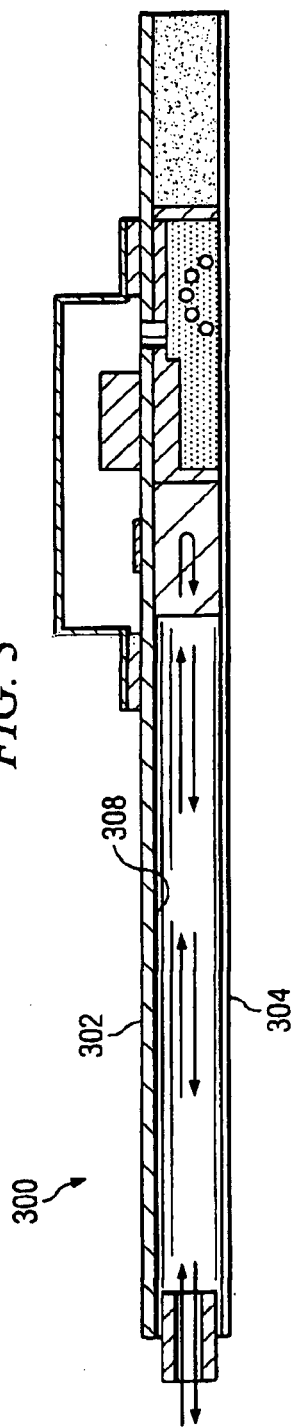

More specifically, FIG. 3 is a diagrammatic fragmentary sectional top view of a portion of a slat which is an alternative embodiment of the slat 16 shown in FIG. 2. In FIG. 3, a cooling plate 110 made of AlSiC has several passageways extending through it, one of which is visible at 111 in FIG. 3. A coolant is caused to flow through the passageway 111, as indicated diagrammatically by broken lines in FIG. 3. The distribution of coolant to respective passageways 111 is effected through respective not-illustrated orifices, in a manner similar to that described above in association with the embodiment of FIG. 2. In FIG. 3, the coolant is water, but could alternatively be ammonia, methanol, a mixture of water and methanol, a mixture of water and ethylene glycol, a fluorinert, or any other suitable two-phase coolant. The cooling plate 110 has openings 116 and 117 provided through opposite sides thereof.

A highly thermally conductive spreader part 121 is fixedly securing within the opening 116 by a ring of a sealant 123. The sealant 123 can be any suitable known sealant, and prevents coolant from leaking out of the passageway 111 around the edges of the thermally conductive part 121. In a similar manner, an identical spreader part 122 is fixedly secured within the opening 117 by a ring of sealant 124. In the embodiment of FIG. 3, the thermally conductive parts 121 and 122 are each made of synthetic diamond, which is highly thermally conductive, but they could alternatively be made of any other suitable material, one example of which is beryllium oxide (BeO).

The thermally conductive parts 121 and 122 each have a plurality of fins or projections 126 or 127 that extend inwardly, in a direction toward the passageway 111. The ends of the projections 126 and 127 may be disposed outwardly of, even with the edges of, or within the passageway 111. The length and position of the projections 126 and 127 ensures that the coolant will be properly distributed so as to make contact with the projections 126 and 127. The projections 126 and 127 result in a substantial increase in the amount of surface area on the thermally conductive parts 121 and 122 which engages the coolant, in comparison to a not-illustrated configuration in which each of the thermally conductive parts has just a flat inner surface that engages the coolant. Since the projections 126 and 127 significantly increase the amount of surface area on the parts 121 and 122 which engages the coolant, they also significantly increase the rate at which heat can be transferred from the thermally conductive parts 121 and 122 to the coolant.

The thermally conductive parts 121 and 122 each have a flat surface on a side thereof opposite from the projections 126 and 127. A respective MMIC 131 or 132 is fixedly mounted on each of these flat surfaces, with the back side of each MMIC 131 or 132 facing toward and the active-junction side of each MMIC facing away from the associated thermally conductive part 121 or 122. The MMICs 131 and 132 can be secured in place by a known epoxy which is highly thermally conductive, or in any other suitable manner which ensures that the MMICs 131 and 132 are in substantially direct thermal communication with the thermally conductive parts 121 and 122, so as to achieve a very high level of thermal conductivity between each MMIC and the associated thermally conductive part.

Although FIG. 3 shows the thermally conductive parts 121 and 122 which are disposed between the coolant and the MMICs 131 and 132, it would alternatively be possible for the coolant to directly contact the back sides of the MMICs, even if the coolant is electrically conductive. For example, the thermally conductive parts could have openings therethrough which expose the back sides of the MMICs to the coolant, in which case the parts 121 and 122 could be either thermally conductive or non-conductive. Moreover, where the back sides of the MMICs are exposed directly to the coolant, the back sides could be roughened to facilitate heat transfer, and/or could have integral projections similar to the projections 126 and 127 on the thermally conductive parts.

In the embodiment of FIG. 3, two multi-layer circuit boards 138 and 139 are supported on opposite sides of the cooling plate 110. Each of the circuit boards has an opening therethrough, and a respective one of the thermally conductive parts 121 and 122 extends through each such opening. Two transmit/receive modules 146 and 147 are disposed on opposites of the cooling plate 110. The modules 146 and 147 are each generally analogous to the type of transmit/receive module shown at 51 in FIG. 2, although there are some differences.

In this regard, each of the transmit/receive modules 146 and 147 includes a housing defined by a ceramic base plate 148 or 149 that has its peripheral edges fixedly and sealingly secured to edges of a ceramic cover 151 or 152, for example by brazing. The base plates 148 and 149 each have therethrough a stepped opening 153 or 154, which matingly engages a corresponding stepped opening in a respective one of the thermally conductive parts 121 and 122. The base plates 148 and 149 are fixedly and sealingly secured to the respective thermally conductive parts 121 or 122, for example by brazing. Thus, the housings of the modules 146 and 147 are each hermetically sealed.

Each of the transmit/receive modules 146 and 147 has therein a respective circuit board 161 or 162, which in turn has transmit/receive circuitry of a known type thereon, and which has therethrough an opening that accommodates the associated MMIC 131 or 132, and an end of the corresponding thermally conductive part 121 or 122. The MMICs 131 and 132 are each electrically coupled to the associated circuit board 161 or 162 by a plurality of gold wires, for example as indicated diagrammatically at 163 and 164.

The facing surfaces of the base plate 148 and the multi-layer circuit board 138 each have a plurality of pads. A plurality of balls of solder, arranged in what is commonly known as a ball grid array, are provided between the base plate 148 and the circuit board 138. The solder balls 171 of the ball grid array are surrounded by an underfill 173 of a type known in the art, which is not electrically conductive. In a similar manner, facing surfaces of the base plate 149 and the multi-layer circuit board 139 have pads which are electrically coupled to each other by solder balls 172 of a further ball grid array. The solder balls 172 in this second ball grid array are surrounded by an associated underfill 174, which is electrically non-conductive.

The above-mentioned pads on the base plate 148 are electrically coupled to the transmit/receive circuit board 161 in a suitable manner, for example by not-illustrated vias which extend through the base plate 148 in a manner that effects a hermetic seal for the housing of the module 146. In a similar manner, the pads on the base plate 149 are electrically coupled to the transmit/receive circuit board 162 in a suitable manner, for example by not-illustrated vias which extend through the base plate 149 in a manner that effects a hermetic seal for the housing of the module 147.

In operation, the MMICs 131 and 132 each generate substantial amounts of heat, the majority of which is transferred to a respective one of the highly thermally conductive parts 121 and 122. Coolant in a liquid phase enters the passageway 111 from the left side in FIG. 3, and travels rightwardly to the thermally conductive parts 121 and 122. The coolant directly engages the thermally conductive parts 121 and 122, where it absorbs enough heat so that part or all of the coolant boils and is vaporized. The resulting coolant vapor, along with any remaining liquid coolant, continues rightwardly through the passageway 111. It is then eventually routed through a cooling condensation system of the type shown at 27 in FIG. 1, where it is cooled in a manner that causes it to revert from its vapor phase to its liquid phase. After that, this coolant can again be supplied to the passageway 111.

Although only two transmit/receive modules 146 and 147 are visible in FIG. 3, a number of the transmit/receive modules are provided on each side the cooling plate 110 and circuit boards 138 and 139, in a manner comparable to the depiction in FIG. 2 of the column of transmit/receive modules (including the module 51).

The present invention provides a number of technical advantages. One such technical advantage results from the use of a two-phase coolant which engages a heat-generating circuit component, either directly or substantially directly through a highly thermally conductive part, in order to extract heat at a high rate from the circuit component while minimizing the temperature differential between the coolant and the heat-generating structure within the circuit component. This permits the extraction of heat at rates substantially greater than the rates available with pre-existing cooling techniques, and in fact the rates achieved through use of the invention can be as much as five to ten times the existing rate. Since cooling is effected primarily by coolant vaporization, which occurs at a specific temperature, application of the invention to a phased array antenna system offers the advantage of providing a cooling effect at substantially the same temperature throughout the antenna array. This helps to eliminate temperature gradients within the phased array antenna system. As is well known, temperature gradients within a phased array antenna system are disadvantageous because they produce undesirable phase shifts across the array, and these undesirable phase shifts degrade accurate operation. As the operational frequency selected for a phased array antenna system is progressively increased, there is a progressive decrease in the magnitude of permissible temperature gradients within the array. The present invention is highly effective in minimizing temperature gradients, in a manner that permits accurate operation even at high frequencies.

A further advantage results from the use of orifices that control the flow rate or flow volume of coolant to respective heat-generating circuit components, which permits the cooling system to be configured to more efficiently remove different levels of concentrated heat from different circuit components. Still another advantage is that, because the present invention provides highly efficient cooling, it is possible to provide phased array antenna systems which are smaller and lighter than pre-existing systems, and which provide performance that equals or surpasses the performance of larger and heavier preexisting systems. Yet another advantage is that the significant features of the disclosed cooling technique are internal to the system in which the techniques are applied, such as a phased array antenna system.

Although selected embodiments have been illustrated and described in detail, it will be understood that various substitutions and alterations are possible. For example, the invention has been presented in the context of a phased array antenna system, but could alternatively be utilized in some other type of high thermal density electronic system, such as a cell phone ground base station, a high power directed energy weapon, a high power processor device, or a high density power supply. Various other substitutions and alterations are also possible without departing from the spirit and scope of the present invention, and as defined by the following claims.

What is claimed is:

1. An apparatus, comprising:
    a desiccant chamber disposed between a pair of spaced apart substrates, the desiccant chamber having a desiccant disposed therein;
    each substrate comprising:
        one or more electronic devices coupled to an outside surface thereof;
        a cover coupled to the outside surface and housing the one or more electronic devices; and
        a passageway extending from the outside surface at a location within the cover to the desiccant chamber.

2. The apparatus of claim 1, wherein at least some of the electronic devices comprise MMICs.

3. The apparatus of claim 2, further comprising one or more coolant conduits disposed between the substrates and operable to direct a coolant adjacent the MMICs.

4. The apparatus of claim 3, further comprising a heat transfer structure disposed between the substrates and located adjacent the MMICs, the heat transfer structure operable to increase the transfer of heat from the MMICs to the coolant.

5. The apparatus of claim 1, further comprising a humidity sensor disposed within the desiccant chamber, the humidity sensor operable to sense a humidity within the desiccant chamber.

6. The apparatus of claim 1, wherein the cover is coupled to the outside surface of the substrate with a very low water vapor transition rate material.

7. The apparatus of claim 1, wherein the desiccant is selected from the group consisting of desiccant powder, desiccant beads, and a solid desiccant.

8. The apparatus of claim 1, further comprising a fill port coupled to the desiccant chamber to allow desiccant to be placed into the desiccant chamber.

9. The apparatus of claim 1, wherein the electronic devices comprise a plurality of MMICs and a plurality of circulators.

* * * * *

UNITED STATES PATENT AND TRADEMARK OFFICE
CERTIFICATE OF CORRECTION

| | | |
|---|---|---|
| PATENT NO. | : 7,454,920 B2 | Page 1 of 7 |
| APPLICATION NO. | : 10/983001 | |
| DATED | : November 25, 2008 | |
| INVENTOR(S) | : Haws | |

It is certified that error appears in the above-identified patent and that said Letters Patent is hereby corrected as shown below:

The title page, showing an illustrative figure, should be deleted and substitute therefor the attached title page.

Delete drawing sheets 1-3 and substitute therefor the drawing sheets, consisting of figures 1-3 as shown on the attached pages.

Delete Column 1 line 1 to Column 10 line 22 and insert Column 1 line 1 to Column 6 line 11 as attached.

Signed and Sealed this

Sixteenth Day of November, 2010

David J. Kappos
*Director of the United States Patent and Trademark Office*

(12) United States Patent
Haws

(10) Patent No.: US 7,454,920 B2
(45) Date of Patent: Nov. 25, 2008

(54) METHOD AND APPARATUS FOR MOISTURE CONTROL WITHIN A PHASED ARRAY

(75) Inventor: James L. Haws, McKinney, TX (US)

(73) Assignee: Raytheon Company, Waltham, MA (US)

( * ) Notice: Subject to any disclaimer, the term of this patent is extended or adjusted under 35 U.S.C. 154(b) by 537 days.

(21) Appl. No.: 10/983,001

(22) Filed: Nov. 4, 2004

(65) Prior Publication Data
US 2006/0090489 A1    May 4, 2006

(51) Int. Cl.
*F25D 23/12* (2006.01)
*G01N 27/22* (2006.01)

(52) U.S. Cl. .............. 62/176.6; 62/259.2; 236/44 C; 236/44 E; 165/80.4; 340/602; 361/699

(58) Field of Classification Search .......... 62/176.1, 62/176.2, 259.2; 236/44 R, 44 C, 44 E; 340/602, 340/604; 165/80.4; 361/699
See application file for complete search history.

(56) References Cited

U.S. PATENT DOCUMENTS

| | | | | |
|---|---|---|---|---|
| 5,240,556 A | * | 8/1993 | Ishikawa et al. | 216/67 |
| 5,968,386 A | * | 10/1999 | Goenka et al. | 219/209 |
| 6,161,765 A | | 12/2000 | Kay et al. | |
| 6,205,796 B1 | * | 3/2001 | Chu et al. | 62/94 |
| 6,344,777 B1 | * | 2/2002 | Ingram et al. | 330/295 |
| 7,064,953 B2 | * | 6/2006 | Miller | 361/690 |
| 7,114,266 B2 | * | 10/2006 | Gomes et al. | 34/80 |
| 7,195,177 B2 | * | 3/2007 | Haws et al. | 236/44 A |
| 2004/0255598 A1 | | 12/2004 | Haws et al. | |

FOREIGN PATENT DOCUMENTS

EP   0 928 127 A2   7/1999

OTHER PUBLICATIONS

U.S. Appl. No. 10/193,571, entitled *"Method and Apparatus for Removing Heat from a Circuit"*, Haws et al., (36 pages), status pending, Jul. 11, 2002.

* cited by examiner

*Primary Examiner*—Marc E Norman
(74) *Attorney, Agent, or Firm*—Baker Botts L.L.P.

(57) ABSTRACT

According to an embodiment of the present invention, an apparatus includes a base spaced apart from a substrate, the substrate comprising one or more electronic devices coupled to an outside surface thereof, a cover coupled to the outside surface and housing the one or more electronic devices, a desiccant chamber having a desiccant disposed therein disposed between the base and the substrate, and a passageway extending from the outside surface at a location within the cover to the desiccant chamber.

9 Claims, 2 Drawing Sheets

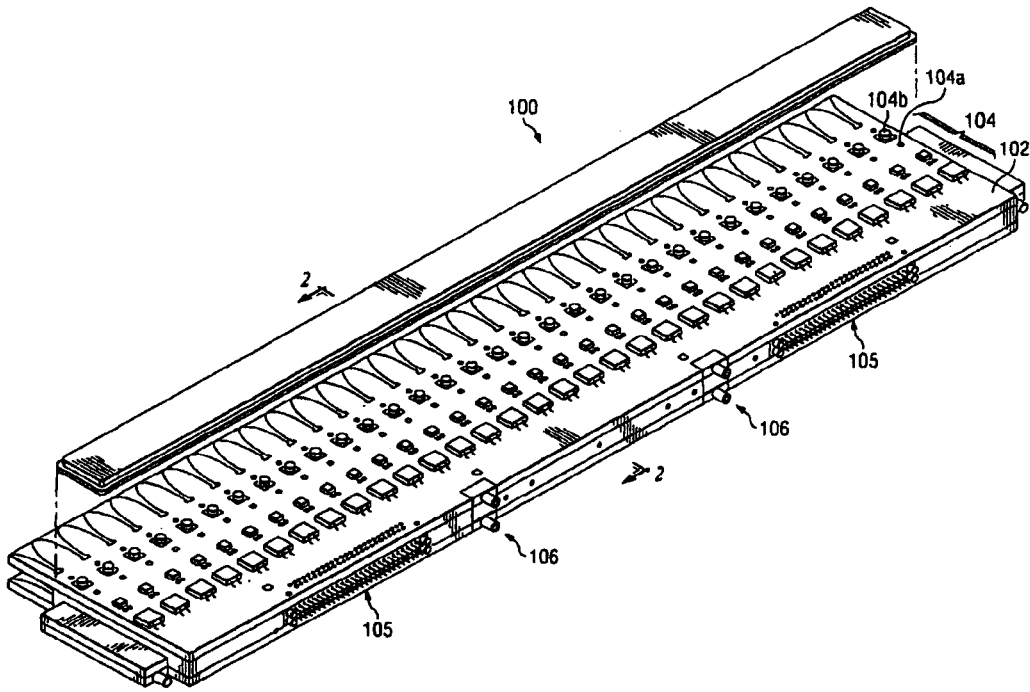

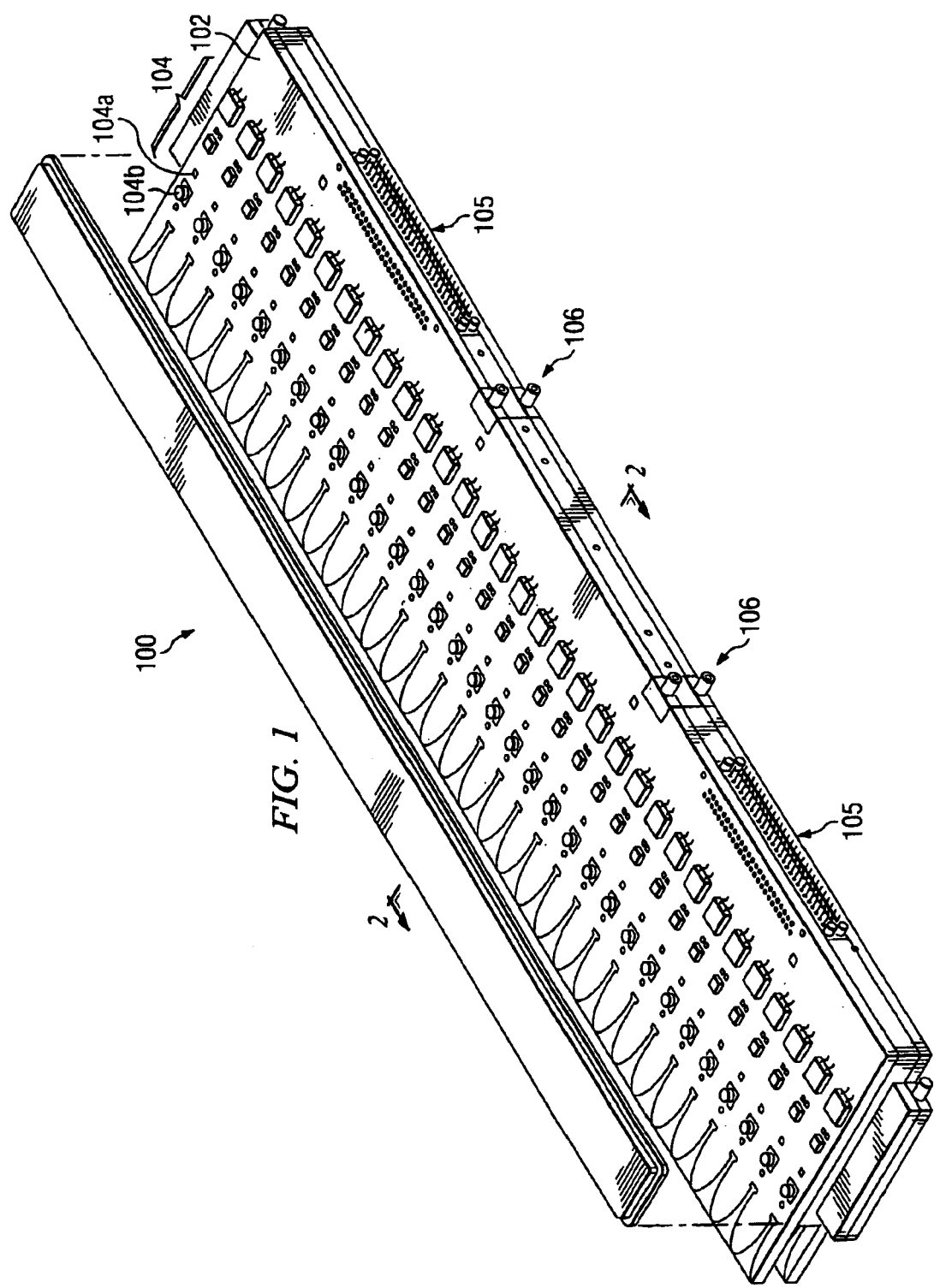

METHOD AND APPARATUS FOR MOISTURE CONTROL WITHIN A PHASED ARRAY

TECHNICAL FIELD OF THE INVENTION

This invention relates in general to humidity control and, more particularly, to moisture control within a phased array.

BACKGROUND OF THE INVENTION

Maintaining a degree of moisture control is desirable for a variety of applications. For example, one application involves devices with electronic circuitry provided within some form of closed housing. The moisture within the closed housing (often caused by humidity) needs to be controlled in order to limit or avoid corrosion of metal within the circuitry or condensation of moisture on exposed radio frequency (RF) circuit lines. As one specific example of this type of application, there is a need to control humidity in electronic assemblies that contain RF gallium arsenide (GaAs) monolithic microwave integrated circuit (MMIC) devices, in order to enhance the overall reliability of the MMIC devices.

Phased array antenna systems often involve the use of MMIC devices. In such an antenna array, the spacing between antenna elements is determined by the operational frequency of the system. Consequently, as the operational frequency increases, the inter-element spacing between adjacent antenna elements decreases, which in turn decreases the size of the array and the amount of space available for the circuitry associated with each antenna element. In a traditional low-frequency antenna array, the array is relatively large, and there is a fair amount of space available in association with each antenna element. Due in part to the amount of available space, each MMIC may be disposed within its own separate hermetic package.

One way in which moisture can enter an electronic package is to leak past a moisture seal, such as an O-ring. An entirely different way in which moisture can enter such a package is through permeation. Permeation refers to the passage of a molecule through a solid barrier, and is different from leakage. In particular, permeation occurs when gas molecules dissolve into one side of a material such as a housing wall, diffuse through that material, and then evaporate from the far side of the material.

SUMMARY OF THE INVENTION

According to an embodiment of the present invention, an apparatus includes a base spaced apart from a substrate, the substrate comprising one or more electronic devices coupled to an outside surface thereof, a cover coupled to the outside surface and housing the one or more electronic devices, a desiccant chamber having a desiccant disposed therein disposed between the base and the substrate, and a passageway extending from the outside surface at a location within the cover to the desiccant chamber.

Embodiments of the invention provide a number of technical advantages. Embodiments of the invention may include all, some, or none of these advantages. For example, the invention may facilitate a subsystem level approach for controlling moisture within an Active Electronically Scanned Array (AESA) to eliminate the need for costly hermetic MMIC packages. In one embodiment, a low water vapor permeability MMIC package and seal minimizes the water vapor permeation during diurnal cycles of temperature and humidity and a desiccator adsorbs moisture. Electronic sensing may be utilized to provide a practical alternative to traditional hermetic packaging for AESA's. Some embodiments provide long term and reliable operation to a wide array of AESA product lines (i.e., ground-based vehicles and airborne and missile arrays) at significantly less cost and weight.

Other technical advantages are readily apparent to one skilled in the art from the following figures, descriptions, and claims.

BRIEF DESCRIPTION OF THE DRAWINGS

FIG. 1 is a perspective view of a subassembly of an active phased array according to one embodiment of the present invention;

FIG. 2 is a cross-section of the subassembly of FIG. 1; and

FIG. 3 is a cross-section of a subassembly of an active phased array according to another embodiment of the present invention.

DETAILED DESCRIPTION OF THE INVENTION

Embodiments of the present invention and some of their advantages are best understood by referring to FIGS. 1 and 3 of the drawings, like numerals being used for like and corresponding parts of the various drawings.

FIG. 1 is a perspective view of a subassembly 100 of an active phased array according to one embodiment of the invention. In the illustrated embodiment, subassembly 100 is an X-band low cost electronically scanned array ("LCESA") dual transmit/receive integrated microwave module ("TRIMM"); however, the present invention contemplates subassembly 100 being any suitable subassembly or assembly of an active electronically scanned array ("AESA"). In the illustrated embodiment, the dual TRIMM subassembly 100 includes an opposed pair of substrates 102 each having a plurality of electronic devices 104 coupled thereto.

Each substrate 102, in the illustrated embodiment, is a radio frequency ("RF") and direct current ("DC") multi-layer board having any suitable RF and DC signal routing therein. Substrate 102 may have any suitable dimensions and thickness and may be formed from any suitable material. Substrates 102 have associated DC, signal, and power connectors 105 and RF input/output connectors 106 in order to receive and transmit appropriate signals for correct operation of subassembly 100.

Electronic devices 104 may be any suitable electronic devices depending on the type and frequency range of operation of subassembly 100. In the illustrated embodiment, at least some electronic devices 104 are monolithic microwave integrated circuits ("MMICs") 104a. Because of the environment subassembly 100 normally operates in, MMICs 104a need to be protected from moisture in order to ensure their correct operation and longevity. Therefore, according to the teachings of some embodiments of the invention, a system for controlling the moisture within subassembly 100 is presented. Details of such a system are described below in conjunction with FIG. 2.

Referring to FIG. 2, a cross-section of subassembly 100 is illustrated. In the illustrated embodiment, a system for controlling moisture within subassembly 100 includes a metal (having a low water vapor transition rate) desiccant chamber 200 disposed between substrates 102 and a desiccant 202 disposed within desiccant chamber 200. A cover 204 is coupled to an outside metallized surface 205 of each substrate 102 and houses MMICs 104a and a plurality of circulators 104b. A metallized passageway 206 extends from surface 205 of each substrate 102 into desiccant chamber 200. Also illustrated in FIG. 2 and being disposed between substrates 102 are cooling conduits 208, a heat transfer structure 210, a foam core 212, and a metal cover 214 for metal (low WVTR) desiccant chamber 200.

Desiccant chamber 200 may be defined in any suitable manner. For example, as illustrated in FIG. 2, desiccant chamber 200 may be defined by the inside volume of a desiccant housing 201. Desiccant housing 201 may be disposed between and coupled to substrates 102 in any suitable manner. Desiccant housing 201 may have an open metal end 215 in order to fill and/or remove desiccant 202 from within desiccant chamber 200. In this embodiment, cover 214 would be a removable cover that couples to desiccant housing 201 and/or substrates 102 in any suitable manner. Both desiccant housing 201 and cover 214 may be formed from any suitable material matched in CTE to cover 204 and outside surface 205, such as a suitable metal. Desiccant chamber 200 may also have an associated fill port 216 in order to fill desiccant chamber 200 with desiccant 202. In this embodiment, fill port 216 may have an associated pinch-off seal in order to keep desiccant 202 within desiccant chamber 200 from escaping and to seal desiccant chamber 200 from the outside environment.

Desiccant 202 may be any suitable material that absorbs moisture and may exist in any suitable form. For example, desiccant 202 may be powder, small spheres, or a molded solid. An example of the type of material that desiccant may be is molecular sieve (uniform net work of synthetic zeolite crystalline pores and cavities).

Covers 204 may be any suitable size and shape and function to house MMICs 104a and circulators 104b. Each cover 204 may run the full length of subassembly 100 (as shown in FIG. 1) or cover 204 may be multiple smaller covers that house individual MMICs 104a and circulators 104b. Cover 204 may be formed from any suitable material, such as metal (e.g., copper or other suitable low water vapor transition rate material matched in CTE to outer surface 205), and may couple to outside surface 205 of substrate 102 in any suitable manner. In one embodiment of the invention, a very low water vapor transition rate material 103 is utilized to couple cover 204 to outside surface 205. However, other suitable materials, such as solder may be utilized.

Passageways 206 extend from outside surfaces 205 of substrates 102 at a location within covers 204 into desiccant chamber 200. Each passageway 206 may be of any suitable size and shape and may be formed in substrate 102 and/or desiccant housing 201 in any suitable manner. In one embodiment, the wall of passageway 206 is plated with a suitable metal coupled to substrates 102 and desiccant chamber 200. Passageway 206 allows any moisture or humidity within cover 204 to be transported down into desiccant chamber 200 where it is absorbed by desiccant 202. Depending on the type of desiccant 202 utilized, a filter screen (not explicitly illustrated) may be disposed within passageway 206 in order to keep desiccant 202 from escaping desiccant chamber 200 up into the inside of cover 204.

In order to monitor the humidity within desiccant chamber 200, a humidity sensor 220 may be disposed within desiccant chamber 200. Humidity sensor 220 may transmit humidity information to a suitable computing device remote from subassembly 100 in order to relay this information to a user.

In order to regulate the temperature of MMICs 104a, a coolant 221 may be transported through coolant conduits 208 adjacent the location of MMICs 104a. Any suitable coolant may be utilized within the teachings of the present invention.

Coolant conduits 208 may have any suitable routing between substrates 102. In order to increase the transfer of heat from MMICs 104a to coolant 221 during operation, heat transfer structure 210 may be disposed between substrates 102 at a location adjacent MMICs 104a. Heat transfer structure 210 may be any suitable structure, such as fin stock, porous media, or other suitable structure that increases the heat transfer from MMICs 104a to coolant 221. Heat transfer structure 210 may be formed from any suitable material, such as a suitable metal.

Foam core 212 may be any suitable material that provides structural support and stiffness to subassembly 100 by being disposed between substrates 102. Materials forms other than foam may also be utilized within the teachings of the present invention.

In operation of one embodiment of the invention, any moisture that enters covers 204, material 103, or outside surface 205 is drawn into desiccant chamber 200 by passageways 206 and absorbed by desiccant 202. Humidity sensor 220, if utilized, may relay the moisture content within desiccant chamber 200 to a user in order to alert a user that the moisture content has reached a predetermined level, which may indicate that desiccant 202 has to be replaced. In addition, coolant 221 is circulated through coolant conduits 208 through heat transfer structure 210 in order to remove heat from MMICs 104a in order to control the temperature of MMICs 104a to ensure adequate operation. Thus, the system illustrated in FIG. 2 controls the amount of moisture that MMICs 104a are exposed to as well as controlling the temperature of MMICs 104a.

FIG. 3 is a cross-section of a subassembly 300 of an active phased array according to another embodiment of the present invention. Subassembly 300 is a single TRIMM subassembly of an AESA. Subassembly 300 is similar to subassembly 100 of FIG. 2; however, because subassembly 300 is a single TRIMM it possesses only a single substrate 302 and associated components. Opposed to substrate 302 is a suitable base 304 that may be formed from any suitable material and have any suitable thickness.

Subassembly 300 has similar components to that of subassembly 100 of FIG. 2 except that coolant conduits 208 may be in the same general plane as one another. Subassembly 300 also functions similarly to that of subassembly 100 of FIG. 2.

Although embodiments of the invention and some of their advantages are described in detail, a person skilled in the art could make various alterations, additions, and omissions without departing from the spirit and scope of the present invention as defined by the appended claims.

What is claimed is:

1. An apparatus, comprising:
   a desiccant chamber disposed between a pair of spaced apart substrates, the desiccant chamber having a desiccant disposed therein;
   each substrate comprising:
      one or more electronic devices coupled to an outside surface thereof;
      a cover coupled to the outside surface and housing the one or more electronic devices; and
      a passageway extending from the outside surface at a location within the cover to the desiccant chamber.

2. The apparatus of claim 1, wherein at least some of the electronic devices comprise MMICs.

3. The apparatus of claim 2, further comprising one or more coolant conduits disposed between the substrates and operable to direct a coolant adjacent the MMICs.

4. The apparatus of claim 3, further comprising a heat transfer structure disposed between the substrates and located adjacent the MMICs, the heat transfer structure operable to increase the transfer of heat from the MMICs to the coolant.

5. The apparatus of claim 1, further comprising a humidity sensor disposed within the desiccant chamber, the humidity sensor operable to sense a humidity within the desiccant chamber.

6. The apparatus of claim 1, wherein the cover is coupled to the outside surface of the substrate with a very low water vapor transition rate material.

7. The apparatus of claim 1, wherein the desiccant is selected from the group consisting of desiccant powder, desiccant beads, and a solid desiccant.

8. The apparatus of claim 1, further comprising a fill port coupled to the desiccant chamber to allow desiccant to be placed into the desiccant chamber.

9. The apparatus of claim 1, wherein the electronic devices comprise a plurality of MMICs and a plurality of circulators.

* * * * *